United States Patent

Sher

[11] Patent Number: 5,973,900
[45] Date of Patent: Oct. 26, 1999

[54] HIGH VOLTAGE PROTECTION FOR AN INTEGRATED CIRCUIT INPUT BUFFER

[75] Inventor: Joseph C. Sher, Meridian, Id.

[73] Assignee: Micron Technology, Inc., Boise, Id.

[21] Appl. No.: 08/961,781

[22] Filed: Oct. 31, 1997

[51] Int. Cl.[6] .................................................. H02H 3/20
[52] U.S. Cl. ........................................ 361/91.5; 361/111
[58] Field of Search ........................... 361/91, 111, 91.5;
257/355–357; 326/33, 34; 327/310, 313, 333, 437

[56] References Cited

U.S. PATENT DOCUMENTS

| | | | |
|---|---|---|---|
| 4,704,547 | 11/1987 | Kirsch | 307/443 |
| 5,257,222 | 10/1993 | Lee | 365/96 |
| 5,331,196 | 7/1994 | Lowrey et al. | 257/529 |
| 5,341,033 | 8/1994 | Koker | 307/290 |
| 5,381,056 | 1/1995 | Murphy | 326/21 |
| 5,493,244 | 2/1996 | Pathak et al. | 327/313 |
| 5,535,086 | 7/1996 | Mentzer | 361/91 |
| 5,578,941 | 11/1996 | Sher et al. | 326/34 |

*Primary Examiner*—Michael J. Sherry
*Attorney, Agent, or Firm*—Killworth, Gottman, Hagan & Schaeff, LLP

[57] ABSTRACT

Connection of a reference voltage to an inverter of an input buffer is controlled to protect the buffer from damage due to high voltage connected to the buffer so that the inverter is isolated from the reference voltage for application of the high voltage. A supply voltage may be connected to the inverter to ensure the output state of the buffer when the inverter is isolated from the reference voltage. In particular, an input buffer including an inverter having at least one p-channel and at least two n-channel transistors connected in series between a supply voltage and a reference voltage is protected from damage due to high voltage by floating the source and drain of n-channel transistors connected to receive input signals to be buffered. A control signal indicating a high voltage is connected to the buffer turns off the last n-channel transistor in the series chain of transistors and thereby removes the reference voltage from any remaining n-channel transistors in the chain. To ensure the state of the output of the buffer circuit while the n-channel transistors are thus isolated or floating, the drain of the first n-channel transistor in the series chain of transistors is clamped to the supply voltage. A p-channel transistor is connected between the drain of the first n-channel transistor in the chain and the supply voltage to provide the supply voltage clamp in response to the control signal.

22 Claims, 2 Drawing Sheets

HIGH VOLTAGE PROTECTION FOR AN INTEGRATED CIRCUIT INPUT BUFFER

BACKGROUND OF THE INVENTION

The present invention relates in general to input buffers for semiconductor integrated circuits and, more particularly, to methods and apparatus for protecting input buffers from high voltages which are applied to integrated circuits for purposes such as testing and activating programmable interconnection elements. While the present invention can be utilized in a variety of fabrication techniques it will be described with reference to input buffers made using metal oxide silicon (MOS) fabrication techniques and, in particular, complementary MOS (CMOS) fabrication techniques for which it is particularly applicable and initially being applied.

Integrated circuits are tested to ensure that they are free of defects and that the circuits function properly and according to specifications. Testing includes "burn-in" where the circuits are subjected to extremes of operating temperatures and voltages to identify infant failures. Alternate testing can be performed on integrated circuits to test application specific features. Since alternate testing is normally performed by the manufacturer and is not intended to be used by purchasers of the integrated circuits, an electronic key is typically provided to enable the manufacturer to place the circuits into a test mode. A common key is a voltage which is a predetermined level above the maximum specified supply voltage for the circuits. Thus a high voltage key, sometimes referred to as a "supervoltage", may be applied to an input pin of an integrated circuit to place the circuit in a test mode. Once in the test mode, test vectors can be entered using other pins of the integrated circuit to perform required tests.

In some integrated circuits, defects can be corrected by means of one time programmable (OTP) permanent electrical connections which can be implemented with an antifuse. In dynamic random access memories (DRAMs), failing memory cells, rows or columns which are detected during testing can be remapped to functional redundant memory cells, rows or columns by selective permanent programming of antifuse elements. OTP connections are also used to permanently store data on integrated circuits such as programmable logic arrays (PALs), programmable logic devices and programmable read only memories (PROMs) and for other integrated circuit applications. An antifuse element is programmed by applying a programming voltage ranging from approximately 9 volts to approximately 13 volts which is above the maximum supply voltage for the integrated circuits.

In at least both these instances, testing using a supervoltage key and programming antifuses or similar devices, a high voltage is applied to an input pin of an integrated circuit. Portions of an integrated circuit which receive the supervoltage or the programming voltage are designed to withstand the high voltages at least for the time required to perform these operations. Unfortunately, these portions of the integrated circuits cannot be severed practically from input buffers of the integrated circuits which operate with normal signals levels and can be damaged by the high voltage applied for testing and programming. Even if the applied high voltage is less than the breakdown voltage of the devices making up the input buffer such that immediate damage is not done, the resulting voltage stress over time can result in permanent damage to the input buffer and failure of the integrated circuit.

Accordingly, there is a need for improved input buffers which are protected from damage due to high voltage inputs and methods of protecting input buffers.

SUMMARY OF THE INVENTION

This need is met by the invention of the present application wherein connection of a reference voltage to an inverter within an input buffer is controlled to protect the buffer from damage potentially produced by connection of a high voltage to the input buffer by isolating the inverter from the reference voltage. A supply voltage may be connected to the inverter to ensure the state of the output buffer during times that the inverter is isolated from the reference voltage.

More particularly, an input buffer comprising an inverter or input inverter including at least one p-channel and at least two n-channel transistors connected in series between a supply voltage and a reference voltage is protected from potential damage due to high voltage applied to the input of the input buffer by floating the source and drain of n-channel transistors which are connected to receive input signals to be buffered. A control signal indicating that a high voltage is to be applied to the input buffer is connected to the last n-channel transistor of the at least two n-channel transistors to turn off the last n-channel transistor in the series chain of transistors and thereby remove the reference voltage from any remaining n-channel transistors. To ensure the state of the output of the buffer circuit while the n-channel transistors are thus isolated or floating, the n-channel transistors connected to receive an input signal to be buffered are clamped to the supply voltage. A p-channel transistor is connected between the drain of the first n-channel transistor in the series chain of transistors and the supply voltage to provide the supply voltage clamp in response to the control signal.

It is, thus, an object of the present invention to provide improved methods and apparatus for protecting input buffers from high voltages which are applied to the buffers for testing, programming antifuses or the like.

Other objects and advantages of the invention will be apparent from the following description, the accompanying drawings and the appended claims.

DETAILED DESCRIPTION OF THE INVENTION

Figure 1:
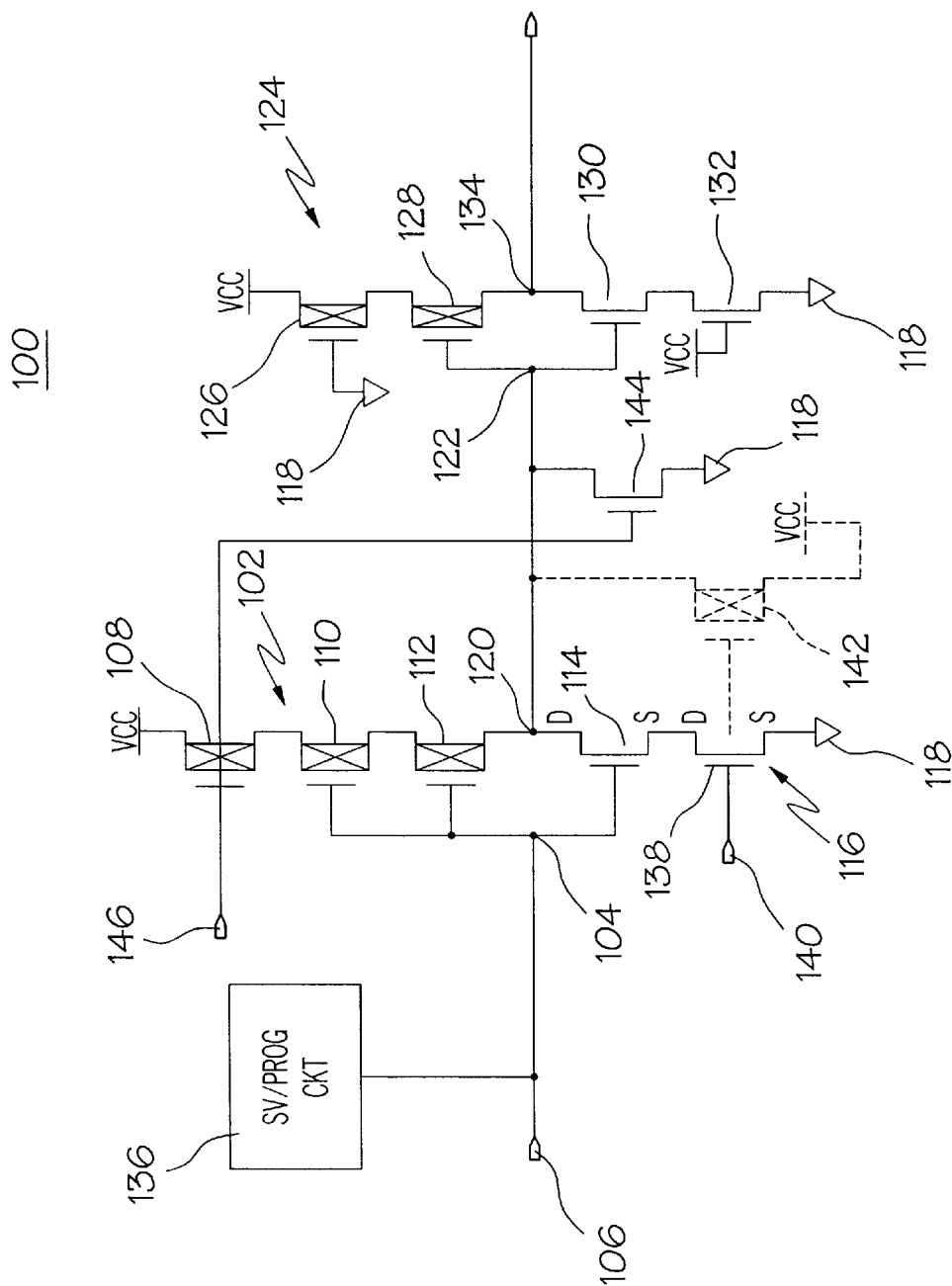
FIG. 1 is a schematic view of first and second embodiments of an input buffer in accordance with the invention of the present application.

Reference will now be made to FIG. 1 wherein a schematic view of first and second embodiments of a CMOS input buffer 100, illustrative of the invention of the present application, are shown. The input buffer 100 includes an input inverter 102 made up of field effect transistors and having an input 104 which is coupled to an input pad 106 of an integrated circuit including the input buffer 100. The input inverter 102 comprises three p-channel transistors 108, 110, 112 and two n-channel transistors 114, 116. The p-channel transistors 108, 110, 112 and the n-channel transistors 114, 116 are coupled in series between a supply voltage VCC and a reference voltage 118 illustrated as being ground potential.

An output 120 of the input inverter 102 is coupled to an input 122 of an output inverter 124. The output inverter comprises two p-channel transistors 126, 128 and two n-channel transistors 130, 132 which are coupled in series between the supply voltage VCC and the reference potential 118. Output signals from the input inverter 102 are inverted by the output inverter 124 to generate buffered output signals at an output 134 of the output inverter 124. While the illustrated input buffer 100 comprises both the input inverter 102 and the output inverter 124, in some applications the output inverter 124 may be eliminated such that the input buffer would comprise only a single inverter, i.e., the input inverter 102. It is noted that the present invention is equally applicable for input buffers regardless of the number of stages or inverters making up the buffers.

In addition to conventional signals having voltage levels within industry standards for CMOS integrated circuits, the input pad 106 receives a high voltage or high voltage signal such as a testing supervoltage or a programming voltage for activating antifuse or other OTP connections. The high voltage received on the input pad 106 actives a supervoltage or programming (SV/PROG) circuit 136 for testing, programming or other appropriate application. In conventional input buffers, a gate 138 of the n-channel transistor 116 is coupled to the input 104 of the input inverter 102 so that the sources and drains of the n-channel transistors are clamped to the reference voltage 118 upon application of a high voltage to the input pad 106. Thus, for conventional input buffers, a high voltage applied to the input pad 106 results in the highest possible voltage difference from the gates to the sources and drains of the n-channel transistors which can cause immediate gate damage. Even if immediate gate damage does not occur, the voltage stress on the gates can, over time, wear out the gate oxide and lead to permanent gate breakdown.

In the input buffer 100 of the present invention, rather than having the gate 138 of the n-channel transistor 116 connected to the input 104 of the input inverter 102, the gate 138 is connected to receive a control signal on, for example, an input pad 140. The control signal is a low voltage signal, indicating that a high voltage will be applied to the input pad 106, to cut off the n-channel transistor 116 thereby isolating the n-channel transistor 114 from the reference voltage 118. The source (S) and drain (D) electrodes of the transistor 114 are, thus, floating as is the drain (D) electrode of the n-channel transistor 116. By allowing the gate to source and drain of the transistor 114 to float or move freely with the gate potential, any gate damage can be substantially reduced since the high voltage damage almost always occurs between the gate and source or gate and drain rather than between the gate and substrate.

An alternate or second embodiment of the present invention is illustrated by the dotted line structure of FIG. 1. In particular for this embodiment, a p-channel clamp transistor 142 is coupled between the drain D of the first n-channel transistor 114 and the supply voltage VCC. The gate electrode of the clamp transistor 142 is coupled to the input pad 140 to receive the control signal and clamp the drain D of the first n-channel transistor 114 to the supply voltage VCC. This embodiment protects the n-channel transistors of the input inverter 102 against high voltage applied to the gate electrode of the first n-channel transistor 114 and also ensures the output state of the buffered output signal from the input buffer 100 during the time that a high voltage is applied to the input pad 106. Since the source S and drain D electrodes of the transistor 114 and the drain D electrode of the n-channel transistor 116 are no longer floating but clamped to VCC, some high voltage protection is forfeited to ensure the output state of the input buffer 100.

In the input inverter 102 of the input buffer 100, all of the p-channel transistors 108, 110, 112 and n-channel transistors 114, 116 can be used to define the p-channel to n-channel size ratio which, together with the supply voltage VCC, determines the input trip point. However, it is currently preferred to form the p-channel transistor 108 and the n-channel transistor 116 to be substantially larger so that only the transistors 110, 112, 114 determine the size ratio. In the illustrated embodiments of FIG. 1, gate electrodes of the p-channel transistor 108 and an n-channel transistor 144 are coupled to an active low enable signal through an input pad 146 to couple VCC to the input inverter 102 when the enable signal is active and to clamp the drain D electrode of the n-channel transistor 114 to the reference voltage or ground potential when the enable signal is not active. The n-channel transistor 144 ensures the output state of the input buffer 100 during power down.

Figure 2:
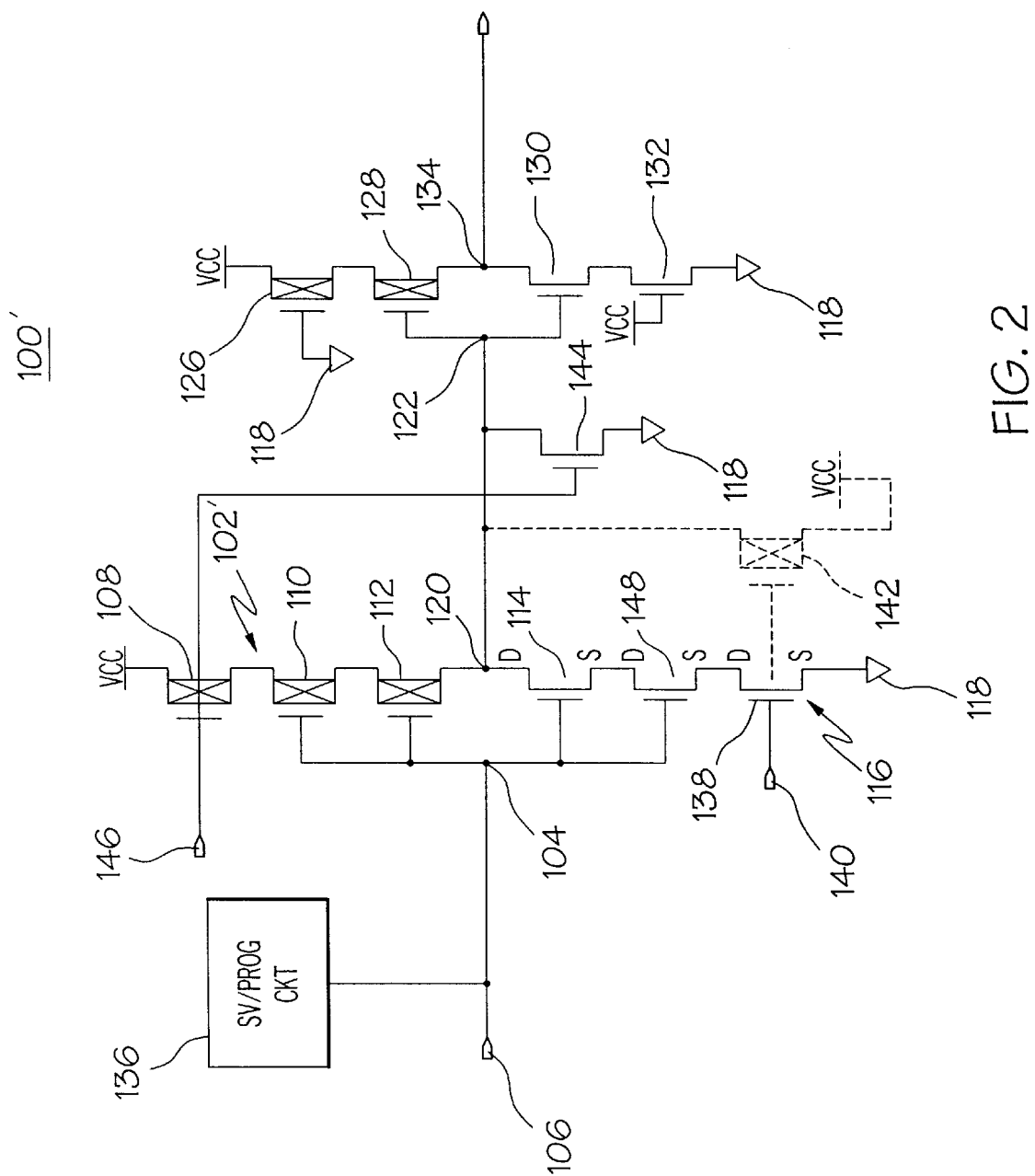
FIG. 2 is a schematic view of third and fourth embodiments of an input buffer in accordance with the invention of the present application.

Reference will now be made to FIG. 2 which illustrates third and fourth embodiments of the present invention. Since the embodiments of FIG. 2 are modifications of the embodiments of FIG. 1, like elements will be labeled using the same reference numerals used in FIG. 1. In the third and fourth embodiments of FIG. 2, an input inverter 102' is again made up of field effect transistors and has an input 104 which is coupled to an input pad 106 of an integrated circuit including the input buffer 100'. The input inverter 102' comprises three p-channel transistors 108, 110, 112 and three n-channel transistors 114, 148, 116. The p-channel transistors 108, 110, 112 and the n-channel transistors 114, 148, 116 are coupled in series between a supply voltage VCC and a reference voltage 118 illustrated as being ground potential.

In the input buffer 100' of FIG. 2, rather than having the gate 138 of the n-channel transistor 116 connected to the input 104 of the input inverter 102', the gate 138 is connected to receive a control signal on, for example, an input pad 140. The control signal is a low voltage signal, indicating that a high voltage will be applied to the input pad 106, to cut off the n-channel transistor 116 thereby isolating the n-channel transistors 114, 148 from the reference voltage 118. The source S and drain D electrodes of the transistors 114, 148 are, thus, floating as is the drain D electrode of the n-channel transistor 116. By allowing the gate to source and drain of the transistors 114, 148 to float or move freely with the gate potential, any gate damage can be substantially reduced since the damage due to high voltage almost always occurs between the gate and source or gate and drain rather than between the gate and substrate.

An alternate or fourth embodiment of the present invention is illustrated by the dotted line structure of FIG. 2. In particular for this embodiment, a p-channel clamp transistor 142 is coupled between the drain D of the first n-channel transistor 114 and the supply voltage VCC. The gate electrode of the clamp transistor 142 is coupled to the input pad 140 to receive the control signal and clamp the drain D of the first n-channel transistor 114 to the supply voltage VCC. This embodiment protects the n-channel transistors of the input inverter 102' against high voltage applied to the gate electrodes of the first and second n-channel transistors 114, 148 and also ensures the state of the buffered output signal from the input buffer 100' during the time that a high voltage is applied to the input pad 106. Since the source S and drain D electrodes of the transistors 114, 148 and the drain D electrode of the n-channel transistor 116 are no longer floating but clamped to VCC, some high voltage protection is forfeited to ensure the output state of the input buffer 100'.

In the input inverter 102' of the input buffer 100' of FIG. 2, all of the p-channel transistors 108, 110, 112 and n-channel transistors 114, 148, 116 can be used to define the p-channel to n-channel size ratio which, together with the supply voltage VCC, determines the input trip point. However, it is currently preferred to form the p-channel transistor 108 and the n-channel transistor 116 to be substantially larger so that only the transistors 110, 112, 114, 148 determine the size ratio. In the illustrated embodiments of FIG. 2, gate electrodes of the p-channel transistor 108 and an n-channel transistor 144 are coupled to an active low enable signal through an input pad 146 to couple VCC to the input inverter 102 when the enable signal is active and to clamp the drain D electrode of the n-channel transistor 114 to the reference voltage or ground potential when the enable signal is not active. The n-channel transistor 144 ensures the output state of the input buffer 100 during power down. In the embodiments of FIG. 2, the p-channel transistors 108, 110, 112 and the n-channel transistors 114, 148 can be fabricated in substantially the same way as conventional input buffers to facilitate production of the input buffers 100'.

In summary, input buffers of the present invention include an inverter for receiving an input signal and generating a responsive buffered output signal with the inverter having at least one p-channel transistor coupled in series with at least two n-channel transistors between a supply voltage and a reference voltage. High voltage protection circuitry is coupled to the inverter for protecting the at least two n-channel transistors against high voltage applied to a gate electrode of at least one of the at least two n-channel transistors. The present invention also encompasses a method of protecting an input buffer from high voltage by providing a control signal indicating that a high voltage is to be applied to the input inverter and removing a connection of an input inverter of the input buffer from a reference potential in response to the control signal. The method may further comprise the step of clamping an output of the input inverter to a supply voltage in response to the control signal.

Having thus described the invention of the present application in detail and by reference to preferred embodiments thereof, it will be apparent that modifications and variations are possible without departing from the scope of the invention defined in the appended claims.

What is claimed is:

1. An input buffer circuit including high voltage protection, said buffer circuit comprising:

an inverter for receiving an input signal on an input thereof and for generating a responsive buffered output signal, said inverter having at least one p-channel transistor coupled in series with at least two n-channel transistors between a supply voltage and a reference voltage; and high voltage protection circuitry coupled to said inverter for protecting said at least two n-channel transistors against high voltage applied to a gate electrode of at least one of said at least two n-channel transistors, said gate electrode of at least one of said at least two n-channel transistors being connected to said input.

2. An input buffer circuit including high voltage protection as claimed in claim 1 wherein said high voltage protection circuitry isolates at least one of said at least two n-channel transistors from said reference voltage.

3. An input buffer circuit including high voltage protection, said buffer circuit comprising:

an input inverter for receiving an input signal on an input thereof and for generating a responsive output signal, said input inverter having at least one p-channel transistor coupled in series with at least two n-channel transistors between a supply voltage and a reference voltage;

an output inverter coupled between said supply voltage and said reference voltage, said output inverter being coupled to said input inverter for generating a buffered output signal at an output of said output inverter in response to said output signal from said input inverter; and high voltage protection circuitry coupled to said input inverter for protecting said at least two n-channel transistors against high voltage applied to a gate electrode of at least one of said at least two n-channel transistors, said gate electrode of at least one of said at least two n-channel transistors being connected to said input.

4. An input buffer circuit including high voltage protection as claimed in claim 3 wherein said high voltage protection circuitry isolates at least one of said at least two n-channel transistors from said reference voltage.

5. An input buffer circuit including high voltage protection as claimed in claim 3 wherein said at least two n-channel transistors comprise first and second n-channel transistors coupled in series with one another, said first n-channel transistor having a gate electrode coupled to said input signal, said high voltage protection circuitry coupling a gate electrode of said second n-channel transistor to a control signal for floating drain and source electrodes of said first n-channel transistor and a drain electrode of said second n-channel transistor for protecting said first n-channel transistor against high voltage applied to a gate electrode of said first n-channel transistor.

6. An input buffer circuit including high voltage protection as claimed in claim 3 wherein said at least two n-channel transistors comprise first, second and third n-channel transistors coupled in series with one another, said first and second n-channel transistors having gate electrodes coupled to said input signal, said high voltage protection circuitry coupling a gate electrode of said third n-channel transistor to a control signal for floating drain and source electrodes of said first and second n-channel transistors and a drain electrode of said third n-channel transistor for protecting said first and second n-channel transistors against high voltage applied to said gate electrodes of said first and second n-channel transistors.

7. An input buffer circuit including high voltage protection as claimed in claim 3 wherein a first one of said at least two n-channel transistors has a gate electrode coupled to said input signal, said high voltage protection circuitry coupling a gate electrode of a last one of said at least two n-channel transistors to a control signal for removing said reference voltage from source and drain terminals of all of said at least two n-channel transistors preceding said last one of said at least two n-channel transistors, said high voltage protection circuitry further comprising a p-channel clamp transistor coupled between said drain of said first n-channel transistor and said supply voltage and having a gate electrode coupled to said control signal to clamp said drain of said first n-channel transistor to said supply voltage for protecting said at least two n-channel transistors against high voltage applied to said gate electrode of said first of said at least two n-channel transistors and for ensuring the state of said buffered output signal at said output of said output inverter.

8. An input buffer circuit including high voltage protection as claimed in claim 7 wherein said at least two n-channel transistors comprise first, second and third n-channel transistors, said first n-channel transistor being said first one of said at least two n-channel transistors and said third n-channel transistor being said last one of said at least two n-channel transistors.

9. An input buffer circuit including high voltage protection as claimed in claim 3 wherein said input buffer circuit is a CMOS integrated circuit.

10. An input buffer circuit including high voltage protection, said buffer circuit comprising:

an input inverter for receiving an input signal and generating a responsive output signal, said input inverter having at least one p-channel transistor coupled in series with first and second n-channel transistors between a supply voltage and a reference voltage, said first n-channel transistor having a gate electrode coupled to said input signal;

an output inverter coupled between said supply voltage and said reference voltage, said output inverter being coupled to said input inverter for generating a buffered output signal at an output of said output inverter in response to said output signal from said input inverter; and high voltage protection circuitry comprising said second n-channel transistor and coupling a gate electrode of said second n-channel transistor to a control signal for floating drain and source electrodes of said first n-channel transistor and a drain electrode of said second n-channel transistor to protect said first n-channel transistor against high voltage applied to a gate electrode of said first n-channel transistor.

11. An input buffer circuit including high voltage protection, said buffer circuit comprising:

an input inverter for receiving an input signal and generating a responsive output signal, said input inverter having at least one p-channel transistor coupled in series with first, second and third n-channel transistors between a supply voltage and a reference voltage, said first and second n-channel transistors having gate electrodes coupled to said input signal;

an output inverter coupled between said supply voltage and said reference voltage, said output inverter being coupled to said input inverter for generating a buffered output signal at an output of said output inverter in response to said output signal from said input inverter; and high voltage protection circuitry comprising said third n-channel transistor and coupling a gate electrode of said third n-channel transistor to a control signal for floating drain and source electrodes of said first and second n-channel transistors and a drain electrode of said third n-channel transistor for protecting said first and second n-channel transistors against high voltage applied to said gate electrodes of said first and second n-channel transistors.

12. An input buffer circuit including high voltage protection, said buffer circuit comprising:

an input inverter for receiving an input signal and generating a responsive output signal, said input inverter having at least one p-channel transistor coupled in series with at least two n-channel transistors between a supply voltage and a reference voltage, a first one of said at least two n-channel transistors having a gate electrode coupled to said input signal;

an output inverter coupled between said supply voltage and said reference voltage, said output inverter being coupled to said input inverter for generating a buffered output signal at an output of said output inverter in response to said output signal from said input inverter; and high voltage protection circuitry comprising a last one of said at least two n-channel transistors and coupling a gate electrode of said last one of said at least two n-channel transistors to a control signal for removing said reference voltage from source and drain terminals of all of said at least two n-channel transistors preceding said last one of said at least two n-channel transistors, and a p-channel clamp transistor coupled between said drain of said first n-channel transistor and said supply voltage and having a gate electrode coupled to said control signal to clamp said drain of said first n-channel transistor to said supply voltage for protecting said at least two n-channel transistors against high voltage applied to said gate electrode of said first of said at least two n-channel transistors and for ensuring the state of said buffered output signal at said output of said output inverter.

13. An input buffer circuit including high voltage protection as claimed in claim 12 wherein said at least two n-channel transistors comprise first, second and third n-channel transistors, said first n-channel transistor being said first one of said at least two n-channel transistors and said third n-channel transistor being said last one of said at least two n-channel transistors.

14. An input buffer circuit including high voltage protection, said buffer circuit comprising: an input inverter for receiving an input signal, said input inverter having a pair of p-channel transistors coupled in series between a supply voltage and an output of said input inverter, and first and second n-channel transistors coupled in series between said output of said input inverter and a reference voltage, said p-channel transistors and said first n-channel transistor having gate electrodes coupled to receive said input signal, and said second n-channel transistor having a gate electrode coupled to receive a control signal for floating source and drain electrodes of said first n-channel transistor for protecting said first and second n-channel transistors against high voltage applied to gate electrodes of said first and second n-channel transistors; and an output inverter coupled between said supply voltage and said reference voltage, said output inverter having an input coupled to said output of said input inverter for generating a buffered output at an output of said output inverter in response to said input signal.

15. An input buffer circuit including high voltage protection, said buffer circuit comprising:

an input inverter for receiving an input signal and generating a responsive output signal, said input inverter having at least one p-channel transistor coupled in series with at least one n-channel transistor, said at least one p-channel transistor and said at least one n-channel transistor being designed to define a p-channel to n-channel size ratio for said inverter circuit and have gate electrodes coupled to an input signal;

a high voltage protection n-channel transistor coupled in series with said at least one p-channel transistor and said at least one n-channel transistor between a supply voltage and a reference voltage, a gate electrode of said high voltage protection n-channel transistor being coupled to a control signal to protect said at least one n-channel transistor from high voltage applied to said gate electrode of said at least one n-channel transistor; and an output inverter coupled between said supply voltage and said reference voltage, said output inverter being coupled to said input inverter for generating a buffered output signal at an output of said output inverter in response to said output signal from said input inverter.

16. A method of protecting an input buffer from high voltage comprising the steps of:

providing a control signal indicating that a high voltage is to be applied to said input inverter; and removing a connection of an input inverter of said input buffer from a reference potential in response to said control signal.

17. A method of protecting an input buffer from high voltage as claimed in claim 16 further comprising the step of clamping an output of said input inverter to a supply voltage in response to said control signal.

18. A method of protecting an input buffer from high voltage 16 wherein said step of removing a connection of an input inverter of said input buffer from a reference potential in response to said control signal comprises the step of coupling said control signal to a gate electrode of an n-channel transistor within said input inverter.

19. A method of protecting an input buffer from high voltage comprising the steps of:

providing a control signal indicating that a high voltage is to be applied to said input inverter; and floating source and drain electrodes of n-channel transistors of n-channel transistors of an input inverter of said input buffer in response to said control signal.

20. A method of protecting an input buffer from high voltage as claimed in claim 19 further comprising the step of clamping an output of said input inverter to a supply voltage in response to said control signal.

21. A method of protecting an input buffer from high voltage comprising the steps of:

providing an input inverter for said input buffer by series coupling at least one p-channel transistor and at least two n-channel transistors;

coupling said input inverter between a supply voltage and a reference voltage;

coupling a gate electrode of a first one of said at least two n-channel transistors to an input signal; and coupling a last one of said at least two n-channel transistors to a control signal to isolate at least one of said at least two n-channel transistors from said reference voltage in response to said control signal.

22. A method of protecting an input buffer from high voltage as claimed in claim 21 further comprising the steps of:

coupling a p-channel transistor between an output of said input inverter and said supply voltage; and coupling a gate electrode of said p-channel transistor to said control signal to set the state of said input inverter.

* * * * *